US012745362B2

(12) United States Patent
Huang et al.

(10) Patent No.: US 12,745,362 B2
(45) Date of Patent: Sep. 22, 2026

(54) ELECTRONIC DEVICE AND IMMERSION COOLING SYSTEM

(71) Applicant: COOLER MASTER CO., LTD, Taipei City, TN (US)

(72) Inventors: Yu-Lun Huang, Taipei City (TW); Hung-Wei Chang, Taipei City (TW)

(73) Assignee: COOLER MASTER CO., LTD, Taipei City (TW)

( * ) Notice: Subject to any disclaimer, the term of this patent is extended or adjusted under 35 U.S.C. 154(b) by 258 days.

(21) Appl. No.: 18/626,717

(22) Filed: Apr. 4, 2024

(65) Prior Publication Data

US 2025/0056751 A1 Feb. 13, 2025

(30) Foreign Application Priority Data

Aug. 11, 2023 (TW) ................................ 112130317

(51) Int. Cl.
*H05K 7/14* (2006.01)
*H05K 7/20* (2006.01)

(52) U.S. Cl.
CPC ....... *H05K 7/1487* (2013.01); *H05K 7/20236* (2013.01); *H05K 7/20772* (2013.01)

(58) Field of Classification Search
CPC ............. H05K 7/1487; H05K 7/20236; H05K 7/20772; G06F 2200/201; G06F 1/182; G06F 1/185; G06F 1/20; G06F 1/184; G06F 1/181
See application file for complete search history.

(56) References Cited

U.S. PATENT DOCUMENTS 5,012,391 A * 4/1991 Schultz, Jr. ............ H05K 3/103 29/850
8,289,692 B2 * 10/2012 Franz ...................... G06F 1/183 361/679.33
8,976,536 B2 * 3/2015 French, Jr. ........... H05K 7/1427 361/755
9,110,640 B2 * 8/2015 Lin ......................... G06F 1/185
10,123,446 B1 * 11/2018 Hou ......................... H05K 5/30
11,974,414 B2 * 4/2024 Ferrer Medina ......... G11C 5/04
2009/0086422 A1 * 4/2009 McClure ............ H05K 7/20727 361/679.48
2009/0294599 A1 * 12/2009 Chen ..................... G06F 1/1607 248/65

(Continued)

FOREIGN PATENT DOCUMENTS

CN 111198601 A 5/2020

OTHER PUBLICATIONS

EU Extended European Search Report dated Dec. 19, 2024 in application 24192415.8.

*Primary Examiner* — Stephen S Sul
(74) *Attorney, Agent, or Firm* — .Merchant & Gould P.C.

(57) ABSTRACT

An immersion cooling system includes an immersion tank and at least one electronic device. The immersion tank is configured to accommodate a coolant. The at least one electronic device is disposed in the immersion tank, and includes a cage assembly, at least one motherboard and a plurality of expansion cards. The cage assembly includes a fixed frame and at least one movable frame. The at least one movable frame are movably disposed on the fixed frame. The at least one motherboard is mounted on the at least one movable frame. The plurality of expansion cards are mounted on the at least one motherboard.

10 Claims, 8 Drawing Sheets

(56) References Cited

U.S. PATENT DOCUMENTS

2011/0132579 A1 6/2011 Best et al.
2013/0050955 A1* 2/2013 Shinsato ................. G06F 1/181 361/727
2014/0126136 A1* 5/2014 Lin ......................... G06F 1/185 361/679.31
2015/0098195 A1 4/2015 Lin et al.
2019/0303333 A1* 10/2019 Ding ........................ G11C 5/04
2020/0295514 A1* 9/2020 Benedict ............ H01R 13/2407
2021/0384661 A1* 12/2021 Coteus ................. H01R 12/721
2023/0232582 A1 7/2023 Liu et al.
2023/0301022 A1* 9/2023 Gao ................... H05K 7/20809 361/699
2024/0015928 A1* 1/2024 Jian .................... H05K 7/20272

* cited by examiner 10
12
121
151
152
15
13
1622
1621
1611
1611
161
162
162
16

ELECTRONIC DEVICE AND IMMERSION COOLING SYSTEM

CROSS-REFERENCE TO RELATED APPLICATIONS

This non-provisional application claims priority under 35 U.S.C. § 119 (a) on Patent Application No(s). 112130317 filed in ROC, on Aug. 11, 2023, the entire contents of which are hereby incorporated by reference.

TECHNICAL FIELD

The present disclosure relates to an electronic device, more particularly to an electronic device configured for an immersion cooling system.

BACKGROUND

With the arrival of the big data era and the continuous development of cloud technology, the requirements for computing and processing units such as expansion cards are higher than ever, and the amount of the data needing to be processed is increasing. Accordingly, the density of heat transferring at the expansion cards rapidly increases, and heat generated thereby also increases massively. Therefore, the problem of heat dissipation needs to be solved urgently.

The expansion cards may be cooled by an immersion cooling system. For example, a motherboard provided with the expansion card is immersed into a coolant to cool the expansion cards so as to maintain the performance and prolong the lifespan of the expansion cards. However, a space of the immersion cooling system is narrow. When there are several expansion cards mounted on the motherboard, the overall size is increased. That is, the motherboard provided with the expansion cards may occupy most of the space of the immersion cooling system. Accordingly, the expansion cards disposed on the motherboard are difficult to be replaced in the narrow space of the immersion cooling system. Therefore, how to reduce the amount of space occupied by the motherboards provided with the expansion cards within the immersion cooling system is an important issue to be solved.

SUMMARY

The present disclosure provides an electronic device and an immersion cooling system so as to reduce the amount of space occupied by the motherboards provided with the expansion cards within the immersion cooling system.

One embodiment of the present disclosure provides an electronic device including a cage assembly, at least one motherboard and a plurality of expansion cards. The cage assembly includes a fixed frame and at least one movable frame. The at least one movable frame are movably disposed on the fixed frame. The at least one motherboard is mounted on the at least one movable frame. The plurality of expansion cards are mounted on the at least one motherboard.

Another embodiment of the present disclosure provides an immersion cooling system including an immersion tank and at least one electronic device. The immersion tank is configured to accommodate a coolant. The at least one electronic device is disposed in the immersion tank, and includes a cage assembly, at least one motherboard and a plurality of expansion cards. The cage assembly includes a fixed frame and at least one movable frame. The at least one movable frame are movably disposed on the fixed frame.

The at least one motherboard is mounted on the at least one movable frame. The plurality of expansion cards are mounted on the at least one motherboard.

According to the electronic device and the immersion cooling system as described in the above embodiments, the at least one motherboard provided with the expansion cards is mounted on the at least one movable frame, such that the at least one motherboard provided with the expansion cards can be integrated with the cage assembly. Therefore, the amount of space occupied by the electronic device within the immersion cooling system can be reduced. In addition, the at least one movable frame can be moved relative to the fixed frame. When the at least one movable frame is opened, the at least one motherboard provided with the expansion cards can be moved along with the at least one movable frame, such that the expansion cards can be replaced more conveniently.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
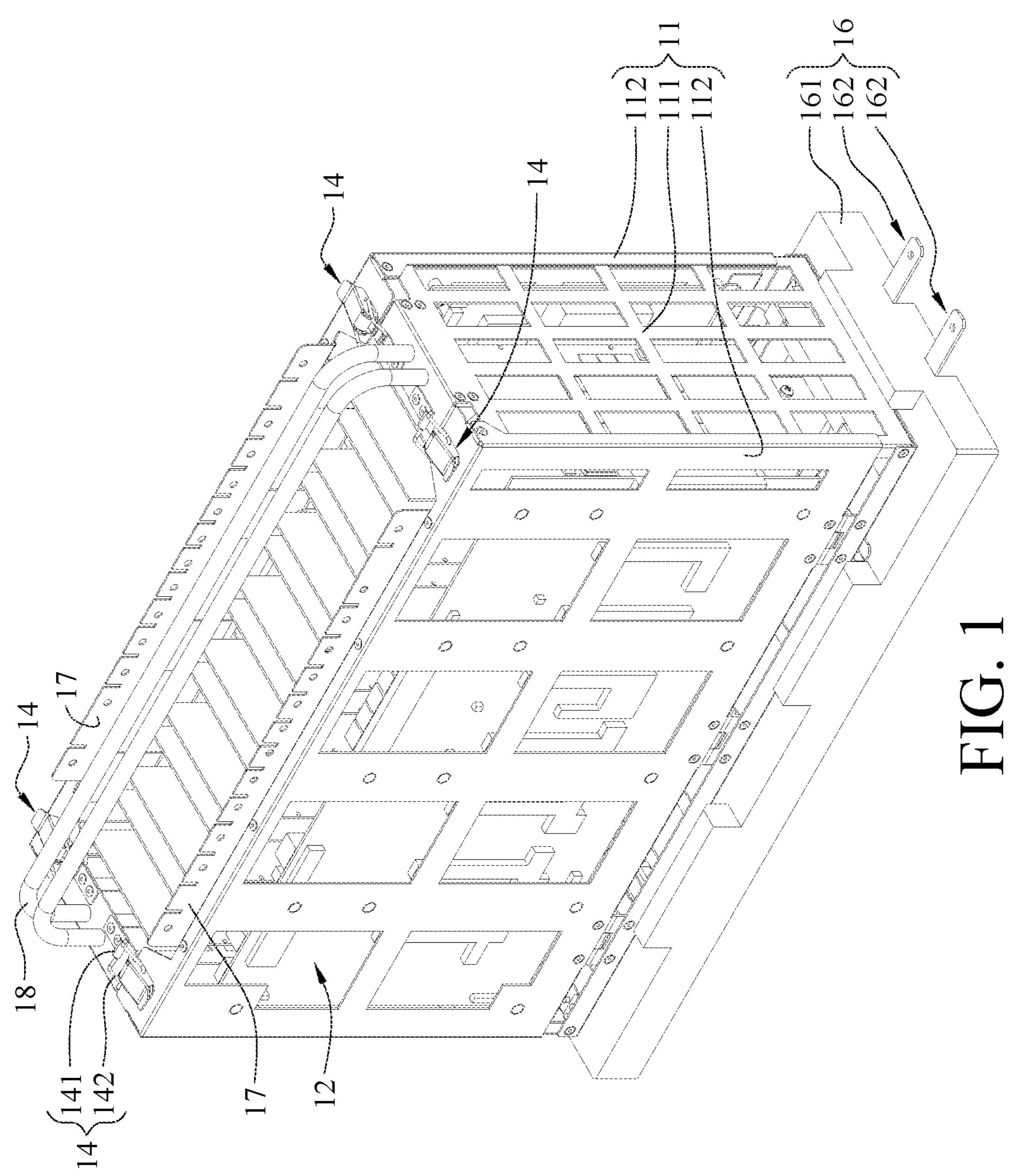
FIG. 1 is a perspective view of an electronic device in accordance with a first embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present disclosure, such as technical and scientific terms, have its own meanings and can be comprehended by those skilled in the art, unless the terms are additionally defined in the present disclosure. That is, the terms used in the following paragraphs should be read on the meaning commonly used in the related fields and will not be overly explained, unless the terms have a specific meaning in the present disclosure.

Figure 2:
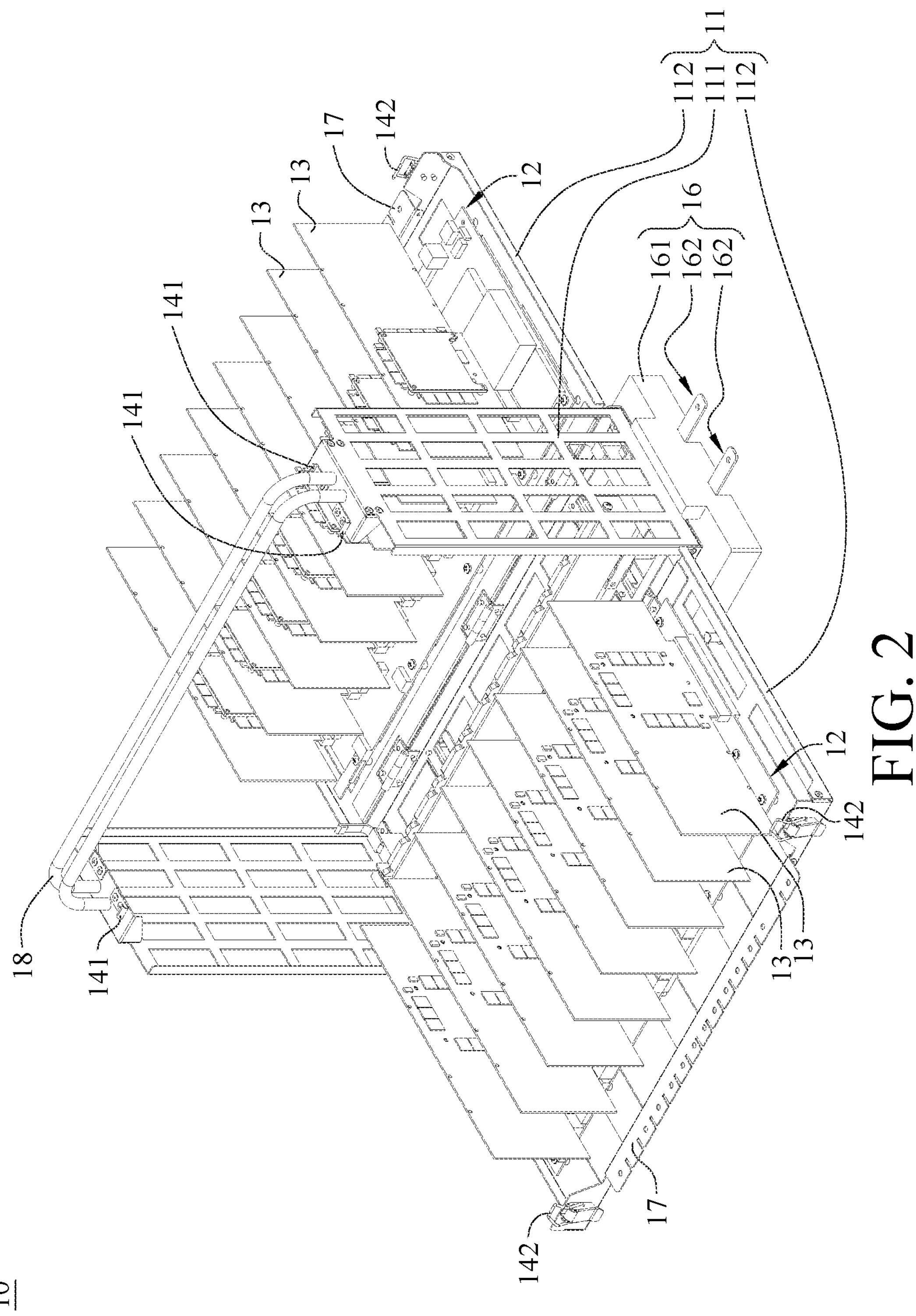
FIG. 2 is another perspective view of the electronic device in FIG. 1.
Figure 3:
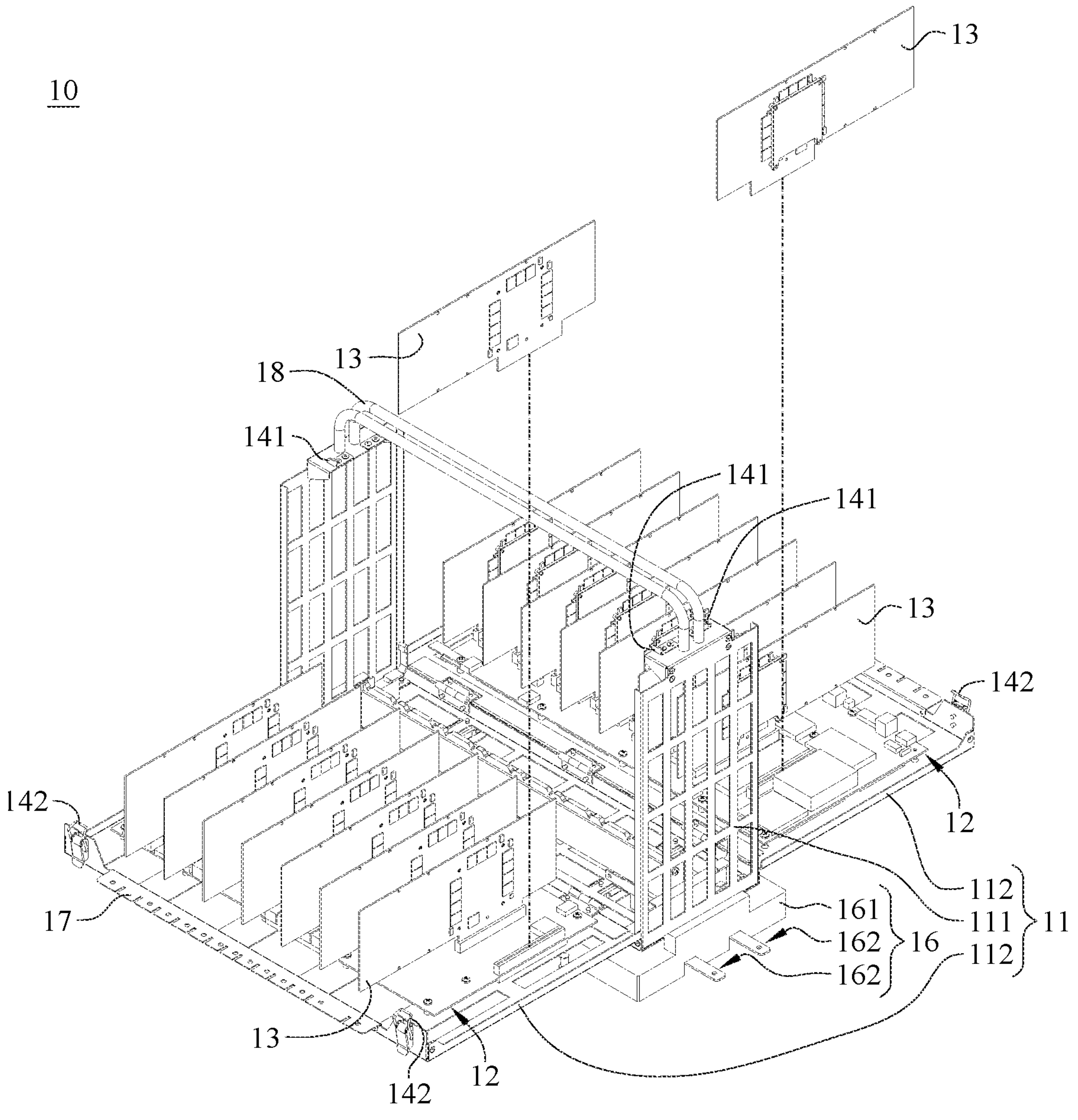
FIG. 3 is an exploded view of the electronic device in FIG. 2.

Please refer to FIG. 1 to FIG. 3, where FIG. 1 is a perspective view of an electronic device 10 in accordance with a first embodiment of the present disclosure, FIG. 2 is another perspective view of the electronic device 10 in FIG. 1, and FIG. 3 is an exploded view of the electronic device 10 in FIG. 2.

In this embodiment, the electronic device 10 includes a cage assembly 11, two motherboards 12, a plurality of expansion cards 13, a plurality of fasteners 14, a plurality of contact electrodes 15 and a conductive seat 16. The cage assembly 11 includes a fixed frame 111 and two movable frames 112. One side of each of the two movable frames 112 is, for example, pivotally disposed on opposite sides of the fixed frame 111, enabling the other side of each of the two movable frames 112 to move closer to the fixed frame 111 for the two movable frames 112 to be in a closed position, or move relatively farther away from the fixed frame 111 for the two movable frames 112 to be in an open position. When the two movable frames 112 are in the closed position, the two movable frames 112 stand upright. When the two movable frames 112 are in the open position, the two movable frames 112 lie flat.

The two motherboards 12 are mounted on the two movable frames 112, respectively. The expansion cards 13 are, for example, graphics cards, and are mounted on the two motherboards 12, respectively. When the two movable frames 112 are in the closed position, the expansion cards 13 respectively disposed on the two motherboards 12 are arranged alternately without interfering with each other.

Each fastener 14 includes a first engagement portion 141 and a second engagement portion 142. The first engagement portions 141 are disposed on the fixed frame 111. The second engagement portions 142 are disposed on the two movable frames 112. The second engagement portions 142 can engaged with the first engagement portions 141 to secure the two movable frames 112 to the fixed frame 111 when the two movable frames 112 are in the closed position. Accordingly, the two motherboards 12 provided with the expansion cards 13 can be integrated with the cage assembly 11.

Figure 4:
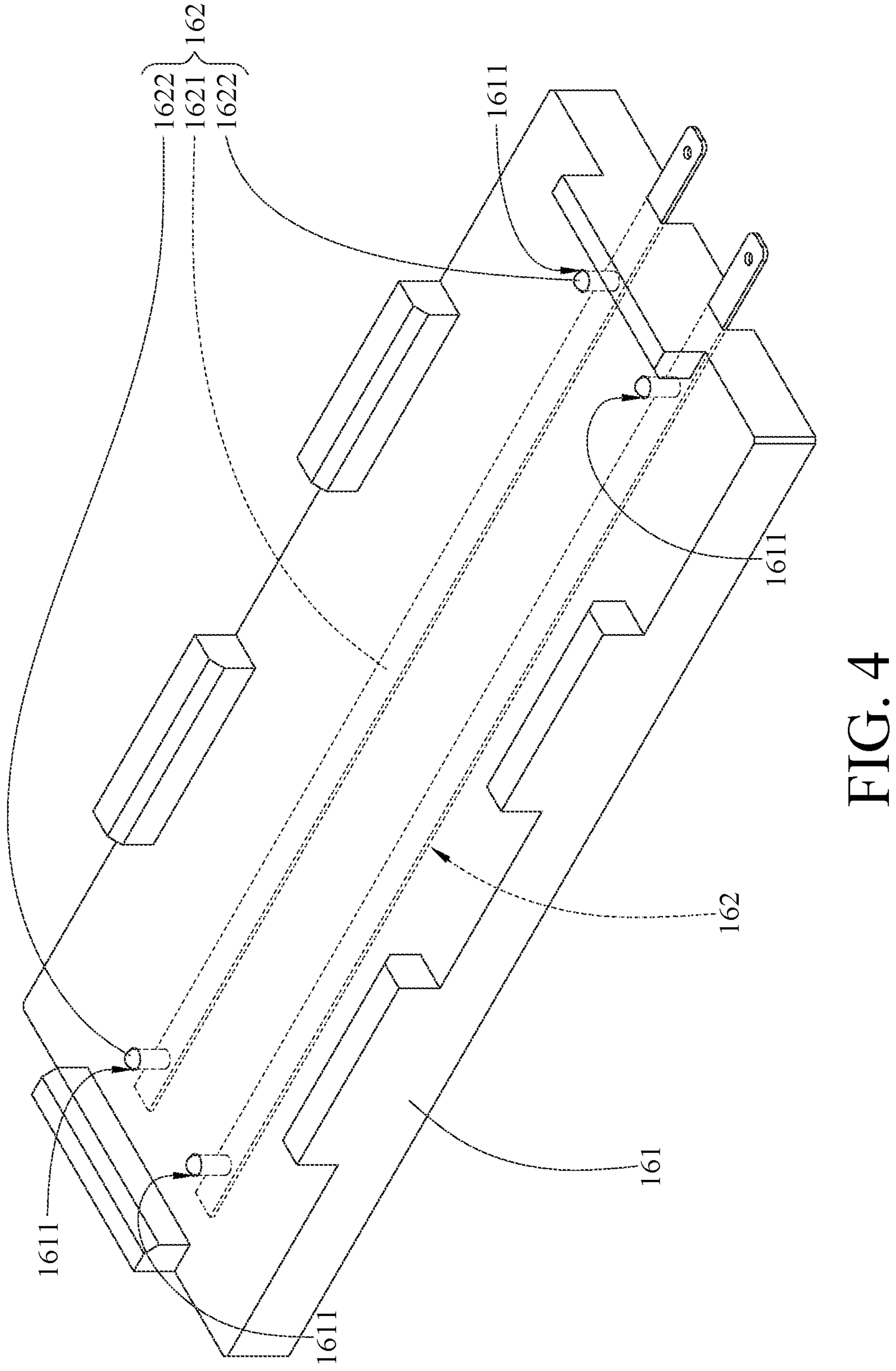
FIG. 4 is a perspective view of a conductive seat of the electronic device in FIG. 1.
Figure 5:
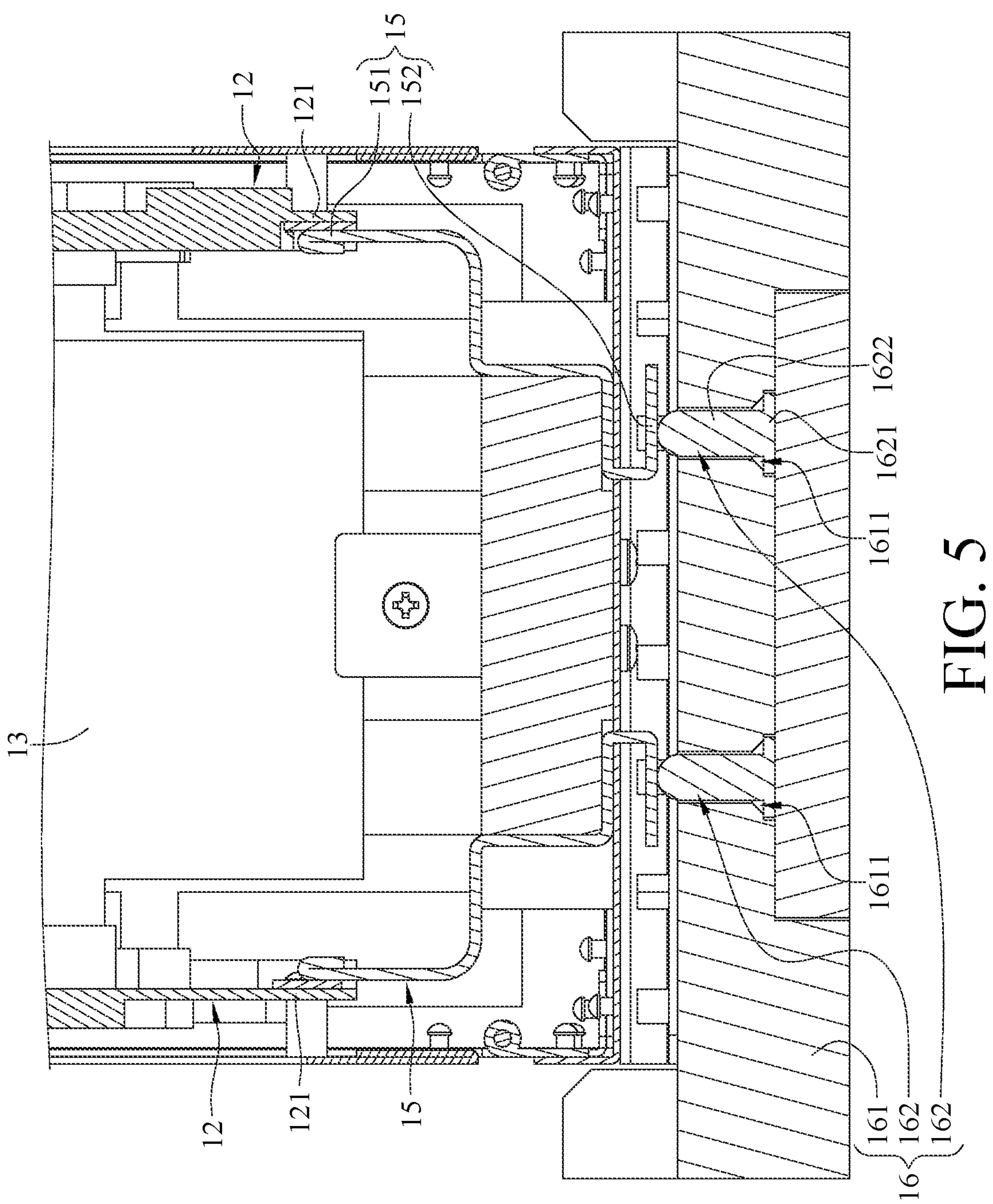
FIG. 5 is a cross-sectional view of the electronic device in FIG. 1.

Please refer to FIG. 1 to FIG. 5, where FIG. 4 is a perspective view of the conductive seat 16 of the electronic device 10 in FIG. 1, and FIG. 5 is a cross-sectional view of the electronic device 10 in FIG. 1

Each motherboard 12 includes a plurality of conductive sheets 121. Each contact electrode 15 has a first contact portion 151 and a second contact portion 152. The second contact portions 152 are located relatively far away from the first contact portions 151. The first contact portions 151 are electrically connected to the conductive sheets 121, respectively. The conductive seat 16 includes a base 161 and a plurality of conductive members 162. The cage assembly 11 is detachably disposed on the base 161. The conductive members 162 are disposed on the base 161. The second contact portions 152 are electrically connected to the conductive members 162, respectively.

Specifically, each conductive member 162 includes a conductive strip 1621 and a plurality of conductive protrusions 1622. The base 161 has a plurality of through holes 1611. The conductive protrusions 1622 are connected to the conductive strip 1621. The conductive protrusions 1622 are disposed through the through holes 1611, respectively. The second contact portions 152 are electrically connected to the conductive protrusions 1622 of the conductive members 162, respectively. The first contact portions 151 and the second contact portions 152 of the contact electrodes 15 are electrically connected to the conductive sheets 121 of the two motherboards 12 and the conductive protrusions 1622 of the conductive members 162, respectively, enabling the transfer of power and signals.

In this embodiment, the electronic device 10 may further include two cable organizers 17. The two cable organizers 17 are disposed on the two movable frames 112, respectively, such that cables (not shown) plugged into the electronic device 10 can be accommodated in the two cable organizers 17 to prevent them from getting disorganized.

In this embodiment, the electronic device 10 may further include a handle 18. The handle 18 is disposed on the fixed frame 111, allowing for convenient portability.

In this embodiment, the advantage of respectively installing the two motherboards 12 provided with the expansion cards 13 on the two movable frames 112 is that since the two motherboards 12 provided with the expansion cards 13 can be integrated with the cage assembly 11, the amount of space occupied by the electronic device 10 within an immersion cooling system can be reduced. In addition, when the two movable frames 112 are opened, the two motherboards 12 provided with the expansion cards 13 can be moved along with the two movable frames 112, such that the expansion cards 13 can be replaced more conveniently.

In this embodiment, the cage assembly 11 includes two movable frames 112, and the electronic device 10 includes two motherboards 12, but the present disclosure is not limited thereto. In other embodiments, the cage assembly may include one movable frame merely, and the electronic device may include one motherboard merely.

Figure 6:
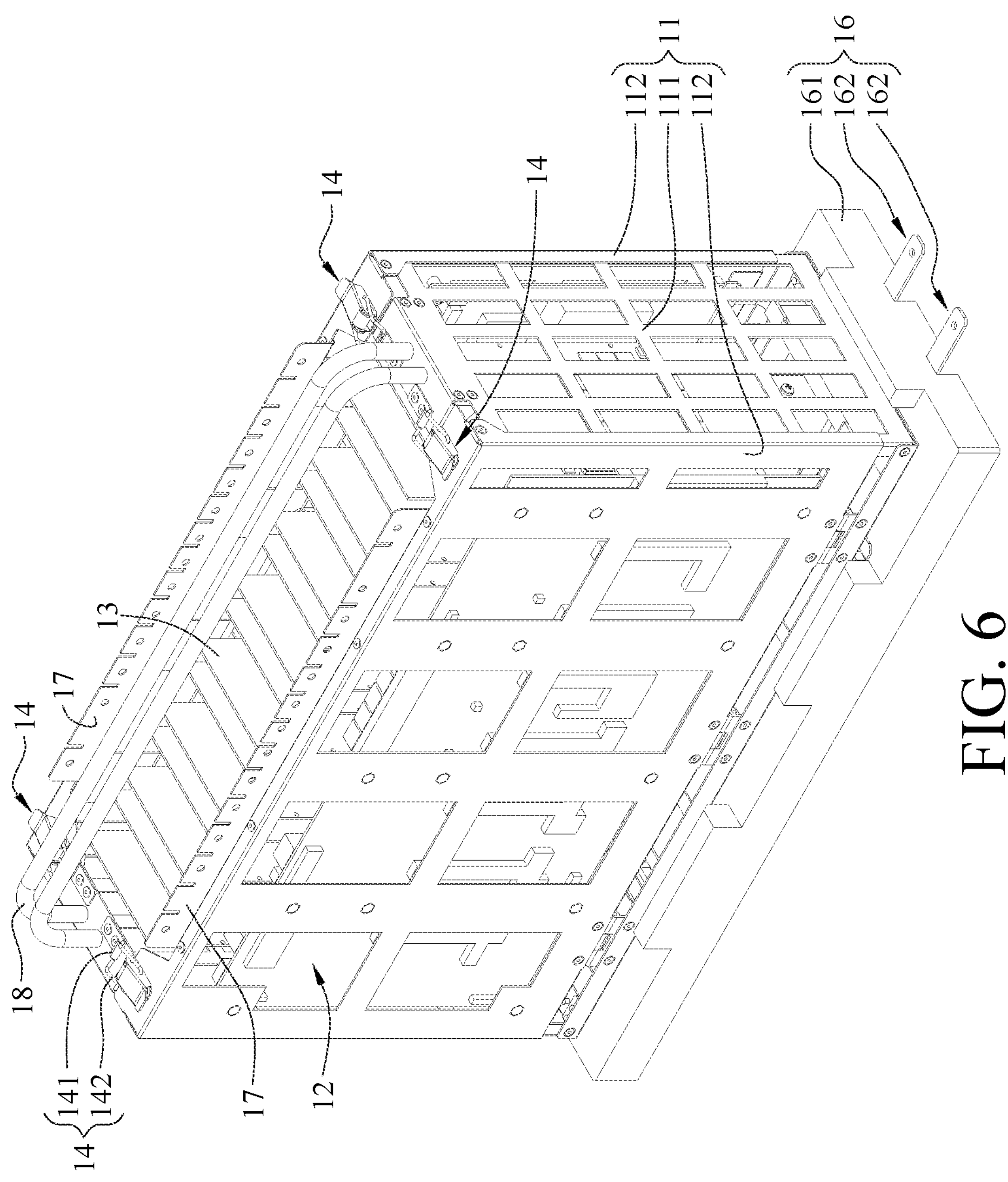
FIG. 6 is a perspective view showing that two movable frames of the electronic device in FIG. 1 are in a closed position.
Figure 7:
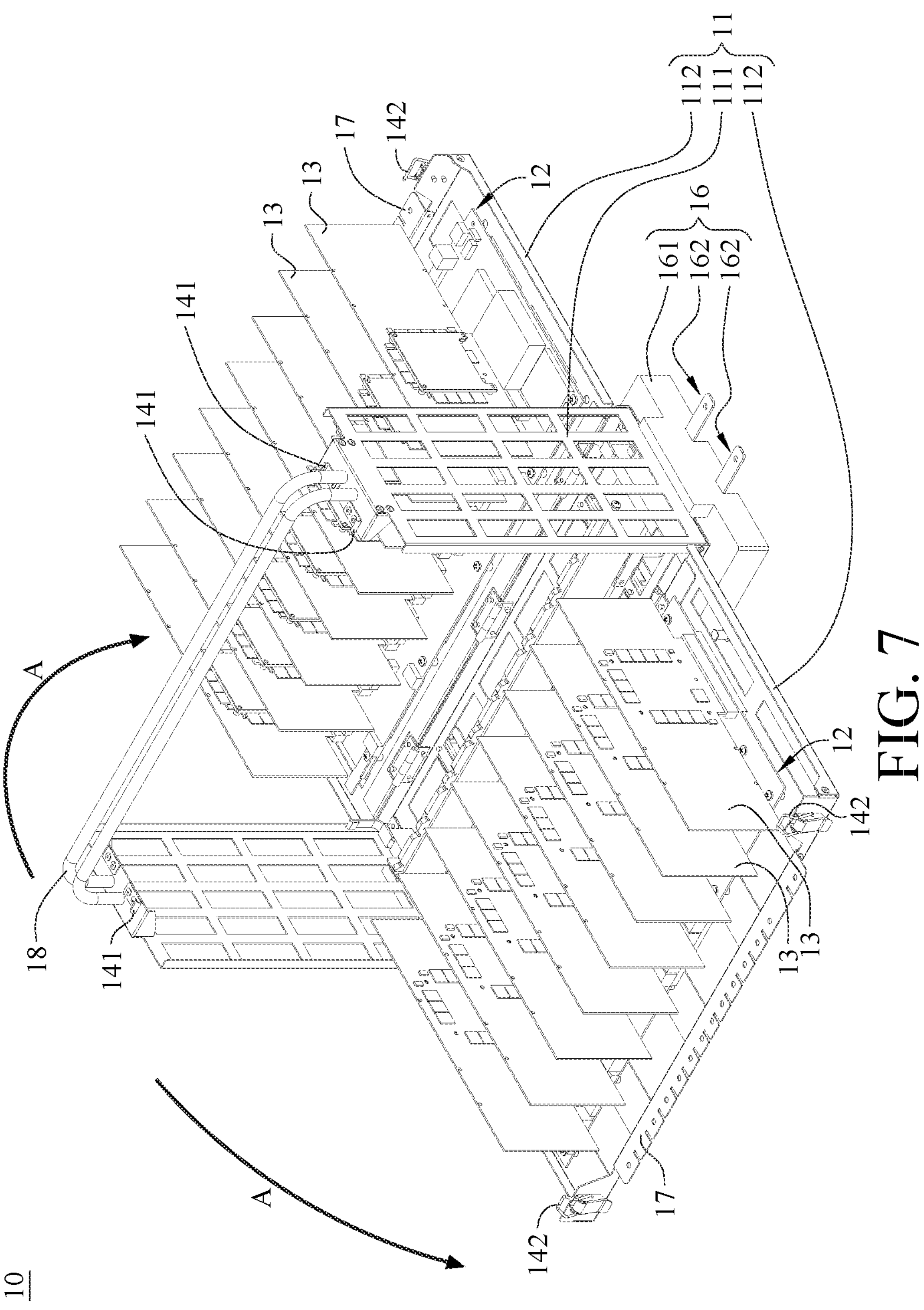
FIG. 7 is a perspective view showing that the two movable frames of the electronic device in FIG. 1 are in an open position.

Please refer to FIG. 6 and FIG. 7, where FIG. 6 is a perspective view showing that the two movable frames 112 of the electronic device 10 in FIG. 1 are in the closed position, and FIG. 7 is a perspective view showing that the two movable frames 112 of the electronic device 10 in FIG. 1 are in the open position.

As shown in FIG. 6, the two movable frames 112 are in the closed position. The second engagement portions 142 are engaged with the first engagement portions 141 to secure the two movable frames 112 provided with the two motherboards 12 to the fixed frame 111. At this time, the two motherboards 12 provided with the expansion cards 13 can be integrated with the cage assembly 11. Therefore, when the electronic device 10 is disposed in the immersion cooling system, the amount of space occupied by the electronic device 10 can be reduced.

As shown in FIG. 7, when the expansion cards 13 need to be replaced, the second engagement portions 142 are firstly released from the first engagement portions 141, and the two movable frames 112 are rotated along a direction A to be opened, respectively, such that the two movable frames 112 are moved from the closed position to the open position. At this time, the two motherboards 12 provided with the expansion cards 13 are also moved along with the two movable frames 112 to the open position, such that the expansion cards 13 can be replaced more conveniently. When the replacement of the expansion cards 13 is finished, the two movable frames 112 are rotated along a direction opposite to the direction A to be closed, respectively, such that the two movable frames 112 are moved from the open position to the closed position. Then, the second engagement portions 142 are engaged with the first engagement portions 141 again to secure the two movable frames 112 to the fixed frame 111.

Figure 8:
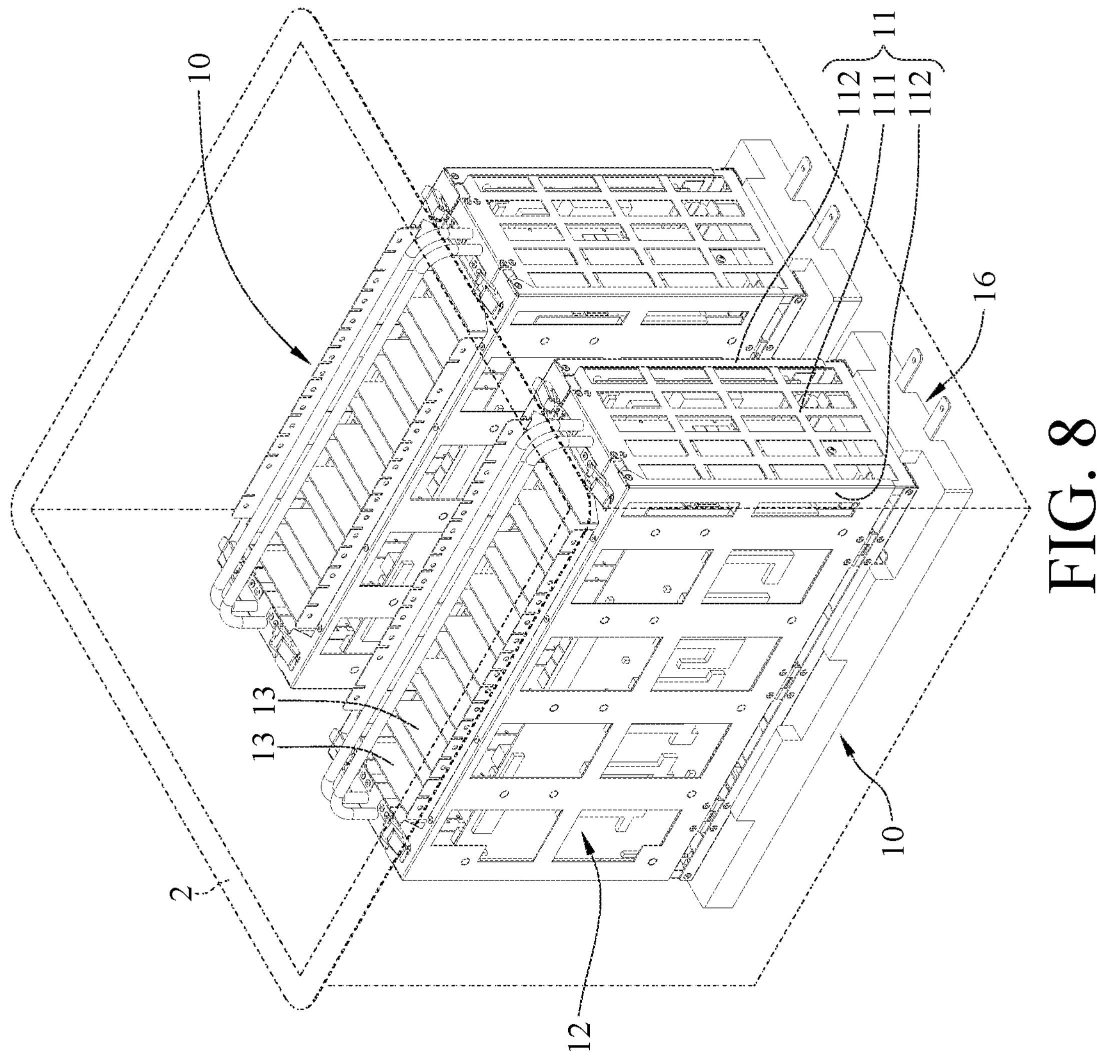
FIG. 8 is a perspective view of an immersion cooling system in accordance with a second embodiment of the present disclosure.

Please refer to FIG. 8, which is a perspective view of an immersion cooling system 1 in accordance with a second embodiment of the present disclosure. In this embodiment, the immersion cooling system 1 includes an immersion tank 2 and a plurality of electronic devices 10. The immersion tank 2 is configured to accommodate a coolant (not shown).

The electronic devices 10 are disposed in the immersion tank 2, and are cooled by the coolant.

Specifically, each electronic device 10 includes a cage assembly 11, two motherboards 12, a plurality of expansion cards 13 and a conductive seat 16. The cage assembly 11 is detachably disposed on the conductive seat 16, and includes a fixed frame 111 and two movable frames 112. One side of each of the two movable frames 112 is, for example, pivotally disposed on opposite sides of the fixed frame 111. The two motherboards 12 are mounted on the two movable frames 112, respectively. The expansion cards 13 are, for example, graphics cards, and are mounted on the two motherboards 12, respectively.

When the expansion cards 13 disposed in the electronic devices 10 require replacement, the cage assembly 11 can be detached from the conductive seat 16 and removed from the immersion tank 2, which enables convenient replacement of the expansion cards 13 in a more spacious environment, avoiding the complexities of performing replacements within a confined space of the immersion tank 2.

In this embodiment, the immersion cooling system 1 includes the plurality of electronic devices 10, but the present disclosure is not limited thereto. In other embodiments, the immersion cooling system may include one electronic device merely.

According to the electronic device and the immersion cooling system as described in the above embodiments, the two motherboards provided with the expansion cards are mounted on the two movable frames, respectively, such that the two motherboards provided with the expansion cards can be integrated with the cage assembly. Therefore, the amount of space occupied by the electronic device within the immersion cooling system can be reduced. In addition, the two movable frames can be moved relative to the fixed frame. When the two movable frames are opened, the two motherboards provided with the expansion cards can be moved along with the two movable frames, such that the expansion cards can be replaced more conveniently.

It will be apparent to those skilled in the art that various modifications and variations can be made to the present disclosure. It is intended that the specification and examples be considered as exemplary embodiments only, with a scope of the present disclosure being indicated by the following claims.

What is claimed is:

1. An electronic device, comprising:

a cage assembly comprising a fixed frame and at least one movable frame movably disposed on the fixed frame;

at least one motherboard, mounted on the at least one movable frame; and a plurality of expansion cards, mounted on the at least one motherboard; and at least one contact electrode; and a conductive seat disposed on a base, wherein:

the at least one contact electrode includes a first contact portion electrically connected to the at least one motherboard and a second contact portion, the conductive seat includes at least one conductive member that has a conductive strip and at least one conductive protrusion, the base has at least one through hole, the at least one conductive protrusion is connected to the conductive strip, the at least one conductive protrusion is disposed through the at least one through hole, and the second contact portion is electrically connected to the at least one conductive protrusion.

2. The electronic device according to claim 1, wherein one side of the at least one movable frame is pivotally disposed on the fixed frame, enabling another side of the at least one movable frame to move closer to the fixed frame for the at least one movable frame to be in a closed position, or move farther away from the fixed frame for the at least one movable frame to be in an open position.

3. The electronic device according to claim 2, wherein the at least one movable frame comprises two movable frames, the at least one motherboard comprises two motherboards, the two movable frames provided with the two motherboards are disposed on two opposite sides of the fixed frame, when the two movable frames are in the closed position, the plurality of expansion cards are respectively disposed on the two motherboards and are arranged alternately.

4. The electronic device according to claim 2, further comprising a plurality of fasteners, wherein each of the plurality of fasteners comprises a first engagement portion and a second engagement portion, the plurality of first engagement portions are disposed on the fixed frame, the plurality of second engagement portions are disposed on the at least one movable frame, and the plurality of second engagement portions are engaged with the plurality of first engagement portions to secure the at least one movable frame to the fixed frame.

5. The electronic device according to claim 1, wherein the at least one motherboard comprises at least one conductive sheet, and the first contact portion is electrically connected to the at least one conductive sheet.

6. The electronic device according to claim 1, wherein the cage assembly is detachably disposed on the base, and the at least one conductive member is disposed on the base.

7. The electronic device according to claim 1, further comprising at least one cable organizer, wherein the at least one cable organizer is disposed on the at least one movable frame.

8. The electronic device according to claim 1, further comprising a handle, wherein the handle is disposed on the fixed frame.

9. The electronic device according to claim 1, wherein the plurality of expansion cards are graphics cards.

10. An immersion cooling system, comprising:

an immersion tank, configured to accommodate a coolant; and at least one electronic device, disposed in the immersion tank, wherein the at least one electronic device comprises:

a cage assembly comprising a fixed frame and at least one movable frame movably disposed on the fixed frame;

at least one motherboard, mounted on the at least one movable frame; and a plurality of expansion cards, mounted on the at least one motherboard; and at least one contact electrode; and a conductive seat disposed on a base, wherein:

the at least one contact electrode includes a first contact portion electrically connected to the at least one motherboard and a second contact portion, the conductive seat includes at least one conductive member that has a conductive strip and at least one conductive protrusion, the base has at least one through hole, the at least one conductive protrusion is connected to the conductive strip, the at least one conductive protrusion is disposed through the at least one through hole, and the second contact portion is electrically connected to the at least one conductive protrusion.

* * * * *